United States Patent
Ukawa (10) Patent No.: US 9,608,182 B2
(45) Date of Patent: Mar. 28, 2017

(54) LIGHT EMITTING DEVICE AND METHOD FOR MANUFACTURING THE SAME

(71) Applicant: Nichia Corporation, Anan-shi, Tokushima (JP)

(72) Inventor: Hiroaki Ukawa, Itano-gun (JP)

(73) Assignee: NICHIA CORPORATION, Anan-Shi (JP)

( * ) Notice: Subject to any disclaimer, the term of this patent is extended or adjusted under 35 U.S.C. 154(b) by 9 days.

(21) Appl. No.: 14/802,992

(22) Filed: Jul. 17, 2015

(65) Prior Publication Data

US 2016/0020369 A1 Jan. 21, 2016

(30) Foreign Application Priority Data

Jul. 18, 2014 (JP) .................................. 2014-147509
Jul. 16, 2015 (JP) .................................. 2015-141788

(51) Int. Cl.
*F21V 3/00* (2015.01)
*H01L 33/58* (2010.01)
(Continued)

(52) U.S. Cl.
CPC ................ *H01L 33/58* (2013.01); *F21K 9/90* (2013.01); *F21V 5/04* (2013.01); *H01L 25/0753* (2013.01);
(Continued)

(58) Field of Classification Search
CPC ..... H01L 2924/181; H01L 2224/49113; H01L 2224/4912; H01L 2224/4918;
(Continued)

(56) References Cited

U.S. PATENT DOCUMENTS 8,373,183 B2 2/2013 Wan et al.
2007/0158669 A1* 7/2007 Lee .......................... H01L 33/62
257/98

(Continued)

FOREIGN PATENT DOCUMENTS

JP 2008-041290 A 2/2008
JP 2008-282754 A 11/2008
(Continued)

OTHER PUBLICATIONS

Extended European Search Report for EP Application No. 15177289.4-1551 dated Dec. 15, 2015.

*Primary Examiner* — Ali Alavi
(74) *Attorney, Agent, or Firm* — Foley & Lardner LLP (57) ABSTRACT

Provided is a light emitting device that reduces color unevenness between a plurality of light emitting elements. A light emitting device 1 includes a base substrate 10, a first frame body 11 disposed at an upper surface 10a of the base substrate 10, and a second frame body 12 disposed at the upper surface 10a of the base substrate 10 and surrounding the first frame body 11 while being spaced away from the first frame body 11. A plurality of light emitting elements 2 is disposed within a region surrounded by the first frame body 11. A first sealing resin 21 is disposed within the region surrounded by the first frame body 11 to cover the light emitting elements 2. The first sealing resin 21 includes a wavelength conversion member that converts a wavelength of light emitted from the light emitting elements 2. A second sealing resin 22 is disposed within the region surrounded by the second frame body 12 to cover the first sealing resin 21. The second sealing resin 22 has a light diffusion material layer 221 having a convex upper surface over the first sealing resin 21.

17 Claims, 6 Drawing Sheets

(51) Int. Cl.

| | |
|---|---|
| *H01L 25/075* | (2006.01) |
| *H01L 33/48* | (2010.01) |
| *H01L 33/50* | (2010.01) |
| *H01L 33/52* | (2010.01) |
| *H01L 33/54* | (2010.01) |
| *H01L 33/62* | (2010.01) |
| *F21K 99/00* | (2016.01) |
| *F21V 5/04* | (2006.01) |
| *H05K 3/30* | (2006.01) |

(52) U.S. Cl.
CPC .......... *H01L 33/486* (2013.01); *H01L 33/505* (2013.01); *H01L 33/507* (2013.01); *H01L 33/52* (2013.01); *H01L 33/54* (2013.01); *H01L 33/62* (2013.01); *H05K 3/303* (2013.01); *H01L 2224/48137* (2013.01); *H01L 2224/49113* (2013.01); *H01L 2924/181* (2013.01); *H01L 2933/005* (2013.01); *H01L 2933/0041* (2013.01); *H05K 2203/1322* (2013.01)

(58) Field of Classification Search
CPC ............. H01L 2933/005; H01L 33/52; H05K 2203/1322; H05K 3/303
See application file for complete search history.

(56) References Cited

U.S. PATENT DOCUMENTS

| | | | |
|---|---|---|---|
| 2007/0170454 A1* | 7/2007 | Andrews | H01L 33/52 257/100 |
| 2007/0278512 A1* | 12/2007 | Loh | B29C 45/1671 257/99 |
| 2011/0075412 A1* | 3/2011 | Wu | F21K 9/00 362/235 |
| 2011/0222280 A1 | 9/2011 | Kim | |
| 2012/0061702 A1 | 3/2012 | Andrews et al. | |
| 2012/0126265 A1* | 5/2012 | Hsu | H01L 33/504 257/98 |
| 2012/0211778 A1* | 8/2012 | Wan | H01L 33/504 257/89 |
| 2012/0322179 A1* | 12/2012 | Chen | H01L 33/0095 438/27 |
| 2013/0121000 A1 | 5/2013 | Lee et al. | |
| 2014/0098529 A1 | 4/2014 | Hata et al. | |

FOREIGN PATENT DOCUMENTS

| | | |
|---|---|---|
| JP | 2011-159970 A | 8/2011 |
| JP | 2011-254079 A | 12/2011 |
| JP | 2013-051375 A | 3/2013 |
| JP | 2013-106047 A | 5/2013 |
| WO | WO-2013/122831 A1 | 8/2013 |
| WO | WO-2012/165007 A1 | 2/2015 |

* cited by examiner

LIGHT EMITTING DEVICE AND METHOD FOR MANUFACTURING THE SAME

CROSS-REFERENCE TO RELATED APPLICATIONS

The present application claims priority under 35 U.S.C. §119 to Japanese Patent Application No. 2014-147509, filed on Jul. 18, 2014, and Japanese Patent Application No. 2015-141788, filed on Jul. 16, 2015. The contents of these applications are incorporated herein by reference in their entirety.

BACKGROUND OF THE INVENTION

Field of the Invention

The present invention relate to a light emitting device and a method for manufacturing the same.

Description of the Related Art

In recent years, in place of conventional light bulbs, light emitting diodes (each hereinafter referred to as an "LED") have been increasingly used in lighting apparatus for general illumination and the like because of less power consumption. Application fields of the light emitting diodes have been expanded (JP 2008-041290 A, JP 2008-282754 A, JP 2011-159970 A). Among these applications, to improve a light extraction efficiency of second optical systems in spotlights, projectors, and the like, LED is required to have high light quality and high power output with decreased unevenness of brightness and color in a light emission surface while having as small a light emission portion as possible.

One of methods for reducing such unevenness of light emission involves blending a filler into a sealing material for a light emitting element to promote light diffusion.

For example, a light emitting device is proposed in which a blue LED is combined with a YAG phosphor that is excited with light emitted from the blue LED to emit yellow fluorescence to obtain a white LED. In this light emitting device, the YAG phosphor is blended into a sealing material, such as resin, for sealing the blue LED mounted in a cup. Into the same sealing material, a diffusion agent is also blended, in addition to the phosphor, thereby more effectively dispersing the phosphor into the sealing resin.

In such a structure, however, unevenness of color sometimes occurs. Specifically, in view of the length of an optical path traveled by the light emitted from the LED element until it is extracted from a light emission surface of the light emitting device, there might be a difference in optical length between light emitted directly from above the LED element and light emitted from the side surface of the LED element and passing through the sealing material. As a result, as the optical path length becomes longer, the amount of components that excite the phosphors dispersed in the sealing resin is increased to cause the shift of color tones. Thus, in some cases, the color unevenness occurs between the part directly above the light emitting element and the surroundings of the light emitting element in the planar view of the light emission surface of the light emitting device.

SUMMARY OF THE INVENTION

Accordingly, it is an object of embodiments of the present invention to provide a light emitting device that reduces the color unevenness.

A light emitting device according to one embodiment of the present invention includes: a base substrate; a first frame body disposed at an upper surface of the base substrate; a second frame body disposed at the upper surface of the base substrate, and surrounding the first frame body while being spaced away from the first frame body; a plurality of light emitting elements disposed within a region surrounded by the first frame body; a first sealing resin disposed within the region surrounded by the first frame body to cover the light emitting elements, the first sealing resin including a wavelength conversion member for converting a wavelength of light emitted from each of the light emitting elements; and a second sealing resin disposed within a region surrounded by the second frame body, the second sealing resin including a light diffusion material layer having a convex upper surface over the first sealing resin.

A method for manufacturing a light emitting device according to another embodiment of the present invention includes the steps of: disposing a plurality of light emitting elements at an upper surface of a base substrate; providing a first frame body at the upper surface of the base substrate so as to surround the light emitting elements, and providing a second frame body at the upper surface of the base substrate so as to surround the first frame body; charging a first sealing resin containing a wavelength conversion member into a region surrounded by the first frame body to cover the light emitting elements; and charging a second sealing resin containing a light diffusion material into a region surrounded by the second frame body so as to cover the first sealing resin to precipitate the light diffusion material contained in the second sealing resin, thereby forming a light diffusion material layer having a convex upper surface over the first sealing resin.

Therefore, the light emitting device and the method of manufacturing the same according to the embodiments of the present invention can reduce the color unevenness between plural light emitting elements.

DETAILED DESCRIPTION OF THE EMBODIMENTS

Embodiments of the present invention will be described in detail below with reference to the accompanying drawings.

Figure 1:
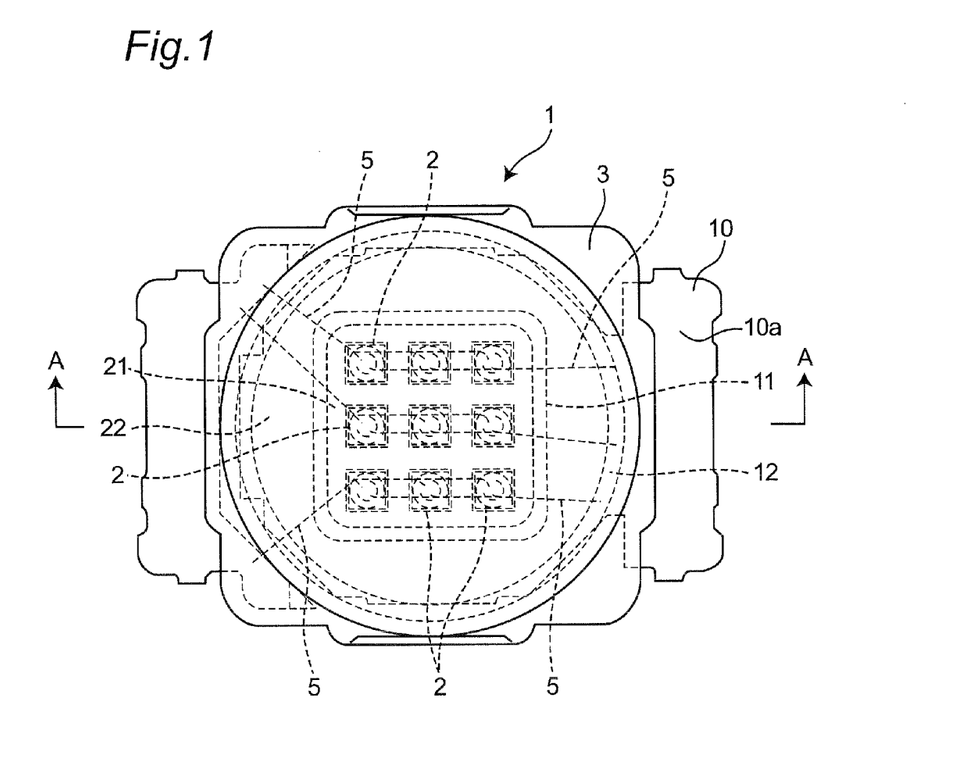
FIG. 1 is a schematic plan view of a light emitting device according to one embodiment of the present invention.
Figure 2:
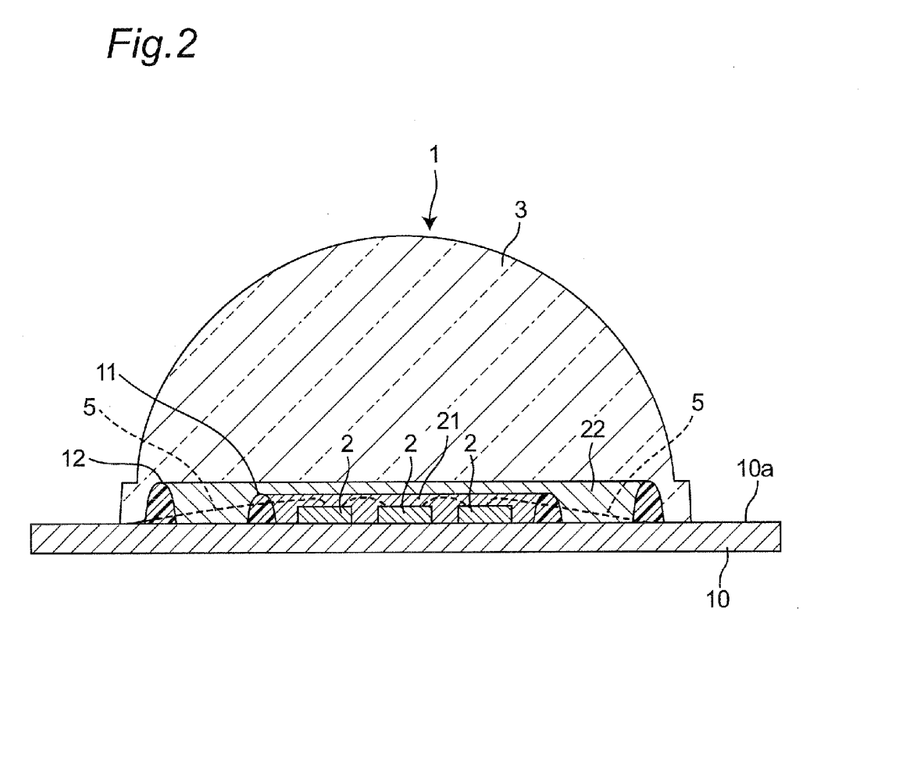
FIG. 2 is a schematic cross-sectional view taken along the line A-A of FIG. 1.
Figure 3A:
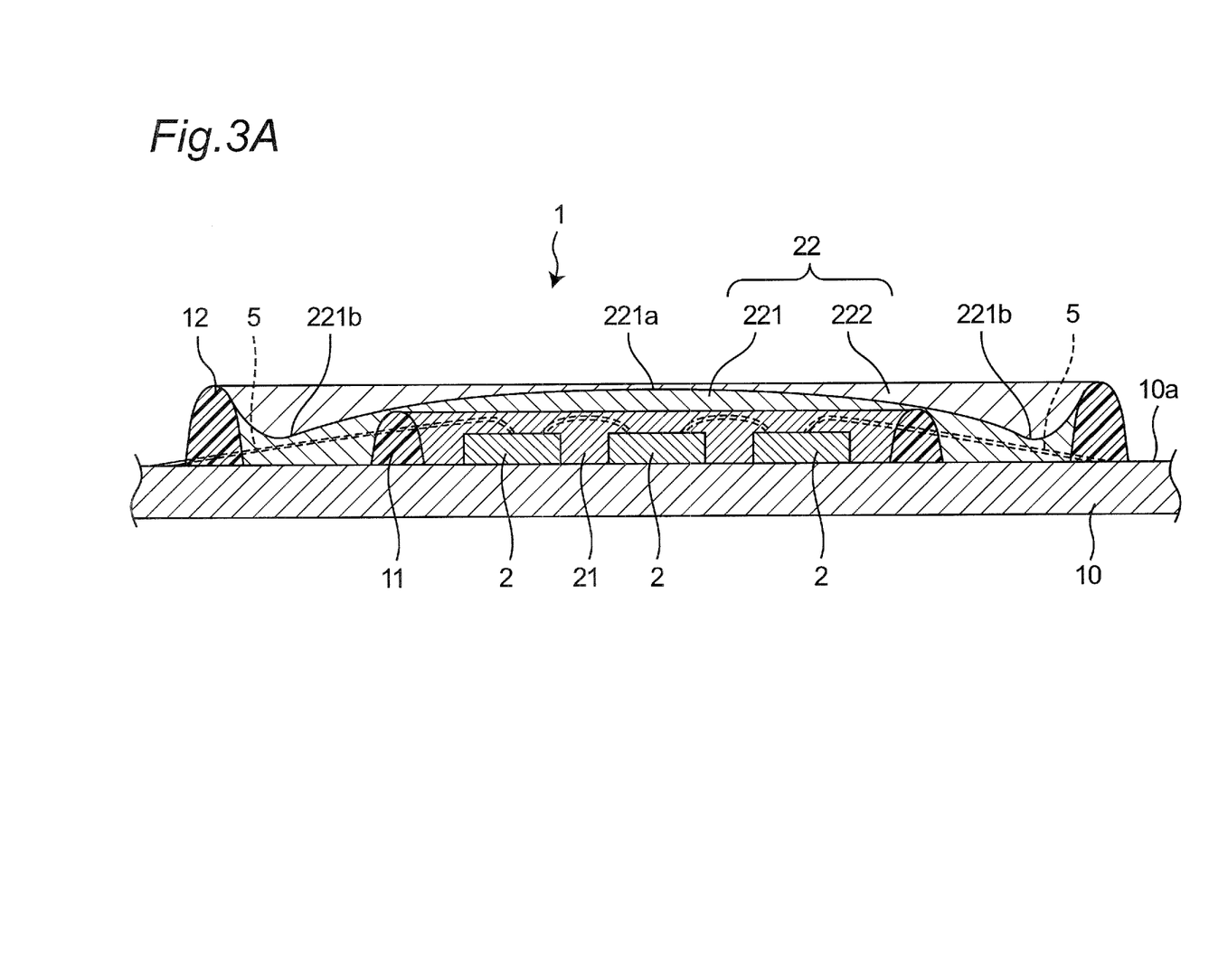
FIG. 3A is an enlarged cross-sectional view showing apart of FIG. 2.

FIG. 1 shows a schematic plan view of a light emitting device according to one embodiment of the present invention. FIG. 2 shows a schematic cross-sectional view of the light emitting device in one embodiment. FIG. 3A is an enlarged view of a part shown in FIG. 2. As illustrated in FIGS. 1 to 3A, a light emitting device 1 includes a base substrate 10, a first frame body 11 disposed at an upper surface 10a of the base substrate 10, and a second frame body 12 disposed at the upper surface 10a of the base substrate 10 and surrounding the first frame body 11 while being spaced away from the first frame body 11.

Each of the first frame body 11 and the second frame body 12 is formed in a circular shape.

A plurality of light emitting elements 2 are arranged within a region surrounded by the first frame body 11, on the upper surface 10a of the base substrate.

A first sealing resin 21 is disposed within the region surrounded by the first frame body 11. The first sealing resin 21 covers the light emitting elements 2. The first sealing resin 21 includes a wavelength conversion member that converts a wavelength of a light emitted from the light emitting elements 2.

A second sealing resin 22 is disposed within a region surrounded by the second frame body 12. The second sealing resin 22 covers the first frame body 11 and the first sealing resin 21. The second sealing resin 22 contains a light diffusion material and has a light diffusion material layer 221 made up of the light diffusion material and disposed on the side of the first sealing resin 21. The light diffusion material contained in the second sealing resin 22 has a larger specific gravity than that of any material of the second sealing resin except for the light diffusion material. Specifically, the light diffusion material layer 221 is formed by precipitating the light diffusion material having a larger specific gravity than that of each resin component contained in the second sealing resin 22, resulting in deposition of a layered structure. That is, the light diffusion material layer 221 is positioned on the lower layer side in the second sealing resin 22. The term "lower layer side" as used herein means a side of the first sealing resin over the first sealing resin. Note that a portion of the light diffusion material (in a state of small particles) not precipitating in such an amount that does not affect the outgoing light from the light emitting device 1 may be dispersed into a part of the second sealing resin 22 except for the light diffusion material layer 221.

The second sealing resin 22 formed in the way mentioned above has the light diffusion material layer 221 with its convex upper surface over the first sealing resin 21 on the side of the first sealing resin 21.

That is, the second sealing resin 22 includes the light diffusion material layer 221, and the light diffusion material layer 221 is formed over the upper surface of the first sealing resin in a convex shape. This is because when the light diffusion material in the second sealing resin 22 is precipitated and deposited, the light diffusion material is deposited while a deposit of the light diffusion material maintaining a stable inclination angle over the upper surface of the first sealing resin 21. A portion of the light diffusion material precipitated over the first frame body 11 having the substantially same height as the upper surface of the first sealing resin 21, and in the vicinity of the first frame body 11 are not deposited over the first frame body 11. The portion of the light diffusion material flows into and deposited between the first frame body 11 and the second frame body 12. As a result, the upper surface of the light diffusion material layer 221 is formed in a convex shape over the upper surface of the first sealing resin 21. The term "convex shape" as used herein may be the shape of a curved surface, or a substantially trapezoidal shape. Preferably, the upper surface of the light diffusion material layer 221 preferably has a top portion 221a over the upper surface of the first sealing resin 21, and at the top portion 221a, the light diffusion material layer 221 is thickest.

The light diffusion material layer 221 is formed outside the first frame body 11, and the upper surface of the light diffusion material layer 221 deposited and positioned between the first and second frame bodies 11 and 12 is formed in a concave shape. The light diffusion material is deposited over the first frame body 11 and the second frame body 12. For this reason, in the case where the first and second frame bodies 11 and 12 have surfaces inclined with respect to the upper surface 10a of the base substrate 10 so that each of the frame body has a cross-sectional shape such as a semicircle, the light diffusion material is also deposited over the inclined surfaces of the first and second frame bodies 11 and 12. In this case, the light diffusion material slips off the inclined surface and is deposited in a large amount in the vicinity of the first and second frame bodies 11 and 12. The term "convex shape" as used herein may be the shape of a curved surface, or a substantially inverted trapezoidal shape. That is, the upper surface of the light diffusion material layer 221 has a lowermost portion 221b located between the first frame body 11 and the second frame body 12. At the lowermost portion 221b, the light diffusion material layer 221 is made thinnest. The height of the lowermost portion 221b is preferably lower than that of the first sealing resin 21. This state shows that the excessive light diffusion material sufficiently flows into between the first and second frame bodies 11 and 12 when the light diffusion material is precipitated and deposited. That is, the excessive light diffusion material is not positioned on the optical path (over the first sealing resin 21) of the light emitting device 1, so that a reduction of an optical transmittance due to a great amount of light diffusion material can be suppressed.

Forming the upper surface of the light diffusion material layer 221 in the concave shape in this way allows the light diffusion material to exist on the side of the base substrate 10 at a higher density, so that a thermal expansion coefficient of the second sealing resin 22 on the side of the base substrate 10 can be decreased. Thus, in the case where the base substrate 10 is made of material having a smaller thermal expansion coefficient than that of the second sealing resin 22, a difference in thermal expansion coefficient between the second sealing resin 22 on the side of the base substrate 10 and the base substrate 10 can be made small, which can prevent the second sealing resin 22 from being peeled off from the base substrate 10, and can also preventing the first and second frame bodies 11 and 12 from being peeled off from the base substrate 10.

Likewise, in the case where the upper surface of the light diffusion material layer 221 is formed in the concave shape, the light diffusion material exists at a higher density in the vicinity of the outer side surface of the first frame body 11 and the inner side surface of the second frame body 12 between the first frame body 11 and the second frame body 12. This can decrease the thermal expansion coefficient of the second sealing resin 22 in the vicinity of the first and second frame bodies 11 and 12. Accordingly, the second sealing resin 22 can be prevented from being peeled off the frame bodies.

The operation of the light emitting device 1 will be described below.

Light emitted from the light emitting element 2 has its wavelength converted by the wavelength conversion member in the first sealing resin 21 when passing through the first sealing resin 21. Then, the light emitting from the light emitting element 2 and the light having its wavelength converted by the wavelength conversion member enter a region of the second sealing resin 22.

Here, in the light emitting device 1 configured in the above-mentioned way, the wavelength conversion member included in the first sealing resin 21 also exists between the light emitting elements 2. The light emitted from the upper surface of the light emitting element 2 and the light emitted from the side surface of the light emitting element 2 have different optical path lengths when passing through the first sealing resin 21, so that the color unevenness occurs.

On the other hand, in the light emitting device 1 of this embodiment, the light diffusion material layer 221 is formed over the upper surface of the first sealing resin 21. The color unevenness generated when the light passes through the first sealing resin 21 is reduced at the light extracting surface of the light emitting device 1 by producing a mixed colored light at the light diffusion material layer 221.

Further, the upper surface of the light diffusion material layer 221 is formed in the convex shape at the upper surface of the first sealing resin 21, so that the amount of the light diffusion material layer 221 can be decreased on the outer peripheral side of the upper surface of the first sealing resin 21. Accordingly, there is no excessive light diffusion material in the optimal path along which the light from the light emitting element 2 travels, which can suppress the reduction in optical transmittance due to any excessive light diffusion material.

In the light emitting device 1 of this embodiment, the light diffusion material layer 221 is formed in the concave shape between the first and second frame bodies 11 and 12, so that no light diffusion material is substantially contained in the second sealing resin 22 located in a higher position than the first and second frame bodies 11 and 12. That is, the second sealing resin 22 placed in the higher position than the first and second frame bodies 11 and 12 and serving as the optimal path for the light does not substantially contain the excessive light diffusion material, which can suppress the reduction in light emission efficiency.

In the light emitting device 1 of this embodiment, the first frame body 11 and the second frame body 12 are disposed spaced away from each other, so that the light diffusion material layer 221 can be formed in the convex shape at the upper surface of the first sealing resin using the flow phenomenon of the light diffusion material contained in the second sealing resin. Here, the first and second frame bodies are not necessarily separated from each other. Alternatively, as long as a region for allowing the light diffusion material to be flowed between the first and second frame bodies is ensured, the first frame body and the second frame body may be disposed to be partially into contact with each other. For example, the upper parts of the first and second frame bodies may be separated from each other, while the lower parts of these frame bodies may be in contact with each other. Even in this case, the light diffusion material layer is flowed and moved between the first and second frame bodies whose upper parts are separated from each other, so that the light diffusion material layer having the upper surface formed in the convex shape over the first sealing resin can be formed.

As mentioned above, the light emitting device 1 of this embodiment allows for deposition of the light diffusion material on a necessary region, so that the amount of the light diffusion material which is deposited on unnecessary regions can be decreased.

In the case where a convex lens 3 is provided to cover the second frame body 12 and the second sealing resin 22, the color unevenness at the center of the upper surface of the first sealing resin 21 tends to be emphasized. For this reason, in the light emitting device with the convex lens 3, as mentioned above, the top portion 221a of the light diffusion material layer 221 is more preferably disposed at the center of the upper surface of the first sealing resin 21. As the lens approaches the center of the upper surface of the first sealing resin 21, the color unevenness can become significant. The presence of the light diffusion material layer 221 with the top portion 221a can effectively suppress the color unevenness.

The method for manufacturing a light emitting device 1 will be described below.

Figure 4A:
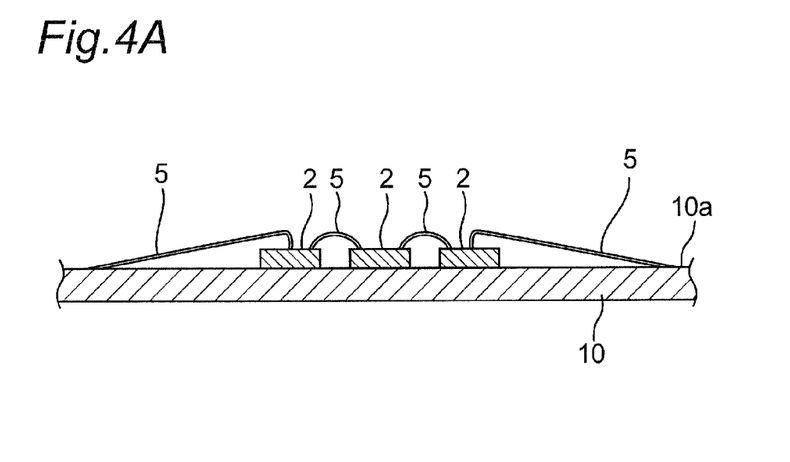
FIG. 4A is an explanatory diagram for explaining a method for manufacturing a light emitting device according to one embodiment of the present invention.
Figure 4B:
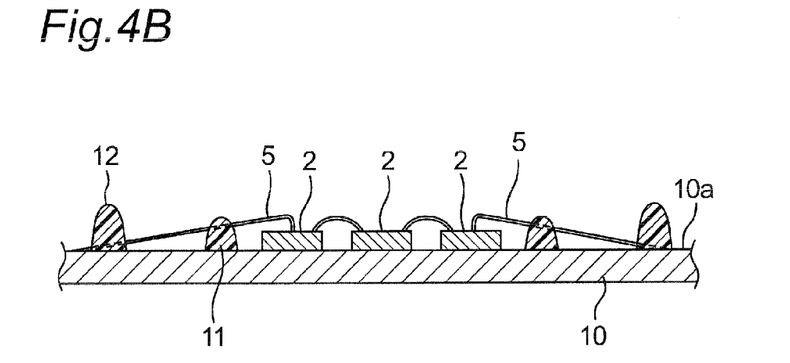
FIG. 4B is an explanatory diagram for explaining the method for manufacturing a light emitting device according to one embodiment of the present invention.
Figure 4C:
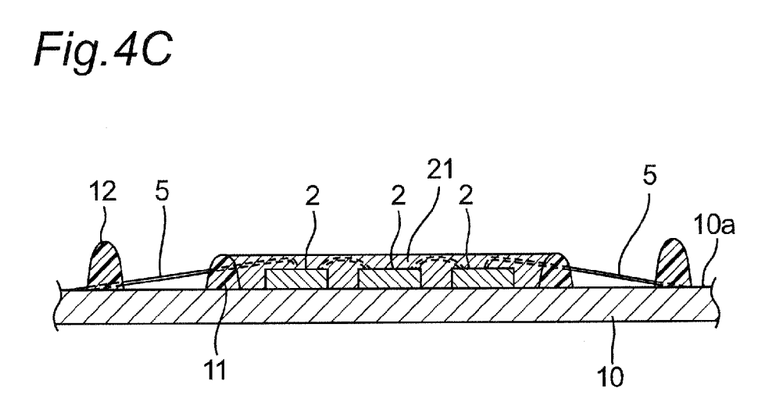
FIG. 4C is an explanatory diagram for explaining the method for manufacturing method a light emitting device according to one embodiment of the present invention.

As shown in FIGS. 1 and 4A, a plurality of light emitting elements 2 are mounted over the upper surface 10a of the base substrate 10. Then, as shown in FIGS. 1 and 4B, the first frame body 11 surrounding the light emitting elements 2 is provided at the upper surface 10a of the base substrate 10, and the second frame body 12 surrounding the first frame body 11 is also provided at the upper surface 10a of the base substrate 10. As illustrated in FIGS. 1 and 4C, the first sealing resin 21 containing the wavelength conversion member is charged into the region surrounded by the first frame body 11 to cover the light emitting elements 2. Note that the second frame body 12 may be provided after the first sealing resin 21 is charged into the first frame body 11. However, the first and second frame bodies are sequentially provided to enable a curing step at the same time for both frames, which can reduce the process time.

Figure 4D:
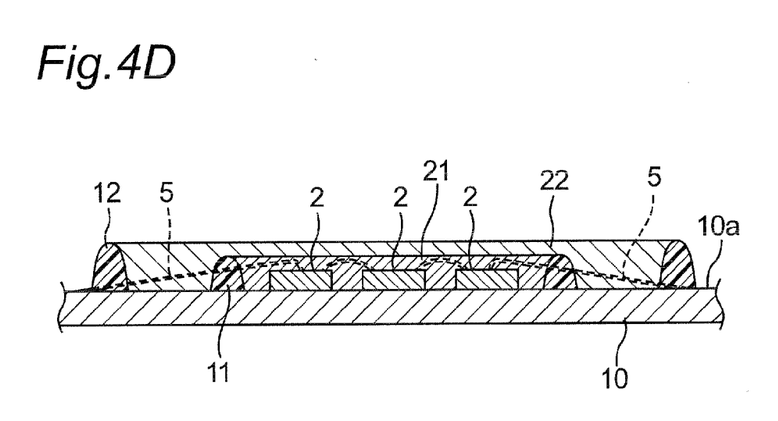
FIG. 4D is an explanatory diagram for explaining the method for manufacturing a light emitting device according to one embodiment of the present invention.

As illustrated in FIGS. 1 and 4D, the second sealing resin 22 containing the light diffusion material is charged into the region surrounded by the second frame body 12 to cover the first sealing resin 21. At this time, the light diffusion material in the second sealing resin 22 in the uncured or semi-cured state has a larger specific gravity than any other material in the second sealing resin 22 except for the light diffusion material, so that the light diffusion material in the second sealing resin 22 is precipitated and deposited on the lower side until the second sealing resin 22 reaches the full-cured state.

The light diffusion material contained in the second sealing resin 22 is precipitated over the first sealing resin 21, so that as shown in FIG. 3A, the upper surface of the light diffusion material layer 221 made of the light diffusion material is formed in the convex shape over the upper surface of the first sealing resin 21. Specifically, first, the second sealing resin 22 in an uncured state and containing the light diffusion material is dropped into approximately the center of the upper surface of the first sealing resin 21. The uncured second sealing resin 22 dropped into the center expands over the upper surface of the first sealing resin 21. After reaching the first frame body 11, the second sealing resin 22 flows out into between the first and second frame bodies 11 and 12 in substantially uncured state until the upper surface of the second sealing resin 22 becomes substantially flat. The light diffusion material contained in the second sealing resin 22 starts precipitating immediately after the second sealing resin 22 is dropped. The light diffusion material continuously precipitates while the second sealing resin 22 is flowing. This closely relates to the formation of the upper surface of the light diffusion material layer 221 in the convex shape over the upper surface of the first sealing resin 21. That is, the light diffusion material, which is precipitated in an initial stage in which the second sealing resin 22 does not sufficiently expand over the upper surface of the first sealing resin 21 directly after being dropped into the center, is then precipitated mainly over the center of the upper surface of the first sealing resin 21. The light diffusion material precipitated at the center increases the concentration of the light diffusion material in the second sealing resin 22 on the side closer to the first sealing resin 21. Apart of the second sealing resin 22 having a higher concentration of the light diffusion material on the side closer to the first sealing resin 21 has a high viscosity and degrades its fluidity, as compared to a part of the second sealing resin having a low optical diffusion material. Most of the light diffusion material precipitated at the initial stage in which the second sealing resin 22 is not sufficiently expanded is pooled at the center of the upper surface of the first sealing resin 21, thus the light diffusion material is deposited in a large amount at the center. After the initial stage, the same phenomenon occurs until the second sealing resin reaches the first frame body 11, and the amount of deposition of the light diffusion material is decreased as the second sealing resin is distant from the center of the upper surface of the first sealing resin 21. As a result, the upper surface of the light diffusion material layer 221 is formed to have the convex shape over the upper surface of the first sealing resin 21. Further, until the second sealing resin 22 reaches the second frame body 12 after getting to the first frame body 11, the light diffusion material that is not deposited over the upper surface of the first sealing resin 21 flows out into between the first and second frame bodies 11 and 12 together with the second sealing resin 22. The second sealing resin 22 flowing into between the first and second frame bodies 11 and 12 rises onto the second frame body by capillarity until a gap between the first and second frame bodies 11 and 12 is sufficiently filled with the second sealing resin 22. As a result, the swollen sealing resin has its surface formed in a recessed, or concave shape. Even in this state, the light diffusion material is precipitated. At this time, the thick parts on both sides of the second sealing resin contain a larger amount of light diffusion material depending on the thickness, which is deposited thickly near the first and second frame bodies 11 and 12. Thus, the concave-shaped light diffusion layer is formed between the first and second frame bodies 11 and 12, corresponding to the concave shape of the surface of the second sealing resin 22.

In this way, in the light emitting device 1 according to this embodiment, the light diffusion material layer 221 with the convex upper surface is formed by utilizing the phenomenon described below.

Specifically, the light diffusion material having a larger specific gravity than the resin components contained in the second sealing resin slips and falls into between the first and second frame bodies 11 and 12 while being precipitated in the resin. The precipitation properties of the light diffusion material contained in the resin can be adjusted by appropriately selecting the kind of resin, the viscosity of resin before curing, the kind of the light diffusion material, and the content of the light diffusion material in the resin. Thus, in this embodiment, the kind of resin, the viscosity of resin before curing, the kind of the light diffusion material, and the content of the light diffusion material in the resin are appropriately selected to enable formation of the light diffusion material layer 221 with the desired convex upper surface.

The light diffusion material contained in the second sealing resin 22 is precipitated between the first and second frame bodies 11 and 12, so that the upper surface of the light diffusion material layer 221 is formed in a convex shape between the first and second frame bodies 11 and 12. That is, since the flow phenomenon of the light diffusion material contained in the resin is used to form the light diffusion material layer 221, the light diffusion material is deposited over the side surfaces of the first and second frame bodies 11 and 12, or the light diffusion material deposited over the upper surfaces of the first and second frame bodies 11 and 12 slips and falls into sides of the side surfaces of the first and second frame bodies 11 and 12. In this way, the upper surface of the light diffusion material layer 221 is formed to have the concave shape and has the lowermost portion 221b located between the first frame body 11 and the second frame body 12.

In this way, the uncured second sealing resin 22 containing the light diffusion material is charged into a part with a difference in height. The part with the height difference includes the upper surface of the first sealing resin 21 enclosed by the first frame body 11 and located in a higher position than the upper surface 10a of the base substrate 10, and the upper surface 10a of the base substrate 10 between the first and second frame bodies 11 and 12. As a result, the light diffusion material layer 221 can be formed to have a convex shape at the higher position and a concave shape at the lower position.

In the method for manufacturing a light emitting device 1, the light diffusion material contained in the second sealing resin 22 is precipitated over the first sealing resin 21, so that the light diffusion material layer 221 made of the light diffusion material is formed over the upper surface of the first sealing resin 21. Thus, the color unevenness due to containing of the plural light emitting elements 2 can be reduced, so that easily manufacturing the light emitting device 1 with little color unevenness can be manufactured easily. Further, the upper surface of the light diffusion material layer 221 is formed in the convex shape, that is, the light diffusion material is disposed in a larger amount at the center of the upper surface of the first sealing resin 21. Thus, even in the case where the convex lens is mounted at the upper surface of the second sealing resin, the color unevenness at the center is not emphasized by the convex lens, so that a mounting portion having a plurality of light emitting elements can serve as a point light source.

In the method for manufacturing a light emitting device 1 in this embodiment, the light diffusion material contained in the second sealing resin 22 is precipitated in between the first and second frame bodies 11 and 12, resulting in formation of the concave-shaped upper surface of the light diffusion material layer 221 between the first and second frame bodies 11 and 12. This can easily manufacture the light emitting device 1 that can save the light diffusion material.

Preferred configurations of the light emitting device according to this embodiment will be described below.

(Base Substrate 10)

The base substrate 10 is, for example, a lead frame. Material for the lead frame is not specifically limited. However, the lead frame is preferably formed of material having a relatively large thermal conductivity. The formation of the substrate using such a material can efficiently release heat generated from the light emitting element 2. For example, suitable materials for the base substrate are those having a thermal conductivity of approximately 200 W/(m·K) or more and a relatively large mechanical strength, while being easily subjected to press punching, etching, or the like. The base substrate is made of, for example, metal, such as copper, aluminum, gold, silver, tungsten, iron, or nickel, or an iron-nickel alloy, phosphor bronze, iron-copper, etc. Alternatively, the base substrate can be one having a surface made of the above-mentioned metal and coated with a metal plated film made of silver, aluminum, copper, gold, etc. In use of the lead frame as the base substrate 10, the base substrate 10 is preferably comprised of a plate-shaped base substrate that has an insulating material between an anode lead and a cathode lead of a plate-shaped lead frame.

Note that the base substrate 10 except for the lead frame can be formed of, for example, insulating materials, including resin material (epoxy resin, such as glass epoxy resin), ceramic (HTCC, LTCC), a composite material of the insulating material and the metal material, or the like.

(Light Emitting Element 2)

The light emitting element 2 is a semiconductor light emitting element, and may be any element which is a so-called light emitting diode. Examples of the light emitting element include a laminated structure including a light emission layer over the substrate, the laminated structure being formed of various semiconductors, including a nitride semiconductor, such InN, AlN, GaN, InGaN, AlGaN, InGaAlN, and the like, a group III-V compound semiconductor, a group II-VI compound semiconductor, and the like.

An emission wavelength of the light emitting element 2 can be changed from an ultraviolet region to a red region by changing materials for the semiconductors, a mixed crystal ratio, an In content in InGaN of the light emitting layer, or the kind of impurities with which the light emission layer is doped.

The light emitting element 2 is electrically connected to the upper surface 10a of the base substrate 10 via wires 5. Suitable materials for the wire 5 can include, for example, metal, such as gold, silver, copper, platinum, or aluminum, and an alloy thereof.

The light emitting elements 2 are mounted in a substantially square-shaped pattern in a top view. Thus, the amounts of first sealing resin 21 disposed between the light emitting elements 2 can be made equal, which can reduce the unevenness of luminescence color. Note that the light emitting elements 2 may be arranged in other patterns, including a rectangular-shaped pattern, a polygonal-shaped pattern, a circular-shaped pattern, and the like. However, in terms of the color unevenness mentioned above, the light emitting elements are preferably arranged in the square-shaped pattern in the top view.

(First Frame Body 11)

The first frame body 11 is provided to surround the light emitting elements 2 mounted on the base substrate 10. The first sealing resin 21 is charged within the region surrounded by the first frame body 11. The first frame body 11 is formed to surround the light emitting elements 2 and serves to dam the first sealing resin 21.

The first frame body 11 is disposed at the upper surface 10a of the base substrate 10, and the light emitting elements 2 are mounted within the region surrounded by the first frame body 11. In other words, the first frame body 11 is disposed to enclose the light emitting elements 2 mounted at the upper surface 10a of the base substrate 10. The first sealing resin 21 is charged within the region surrounded by the first frame body 11 to cover the light emitting elements 2. In this way, the first frame body 11 is used as a dam for charging the first sealing resin 21 thereinto. A first-frame-body resin is placed in the region where the first frame body 11 is to be formed with a desired shape, and then the first-frame-body resin is cured to obtain the first frame body 11.

The first-frame-body resin may be any resin that can be cured after being molded in a desired shape. However, the first-frame-body resin is preferably a resin having excellent adhesion to the base substrate 10 as well as the first sealing resin 21. Such resins can include, for example, a silicone resin, an epoxy resin, etc. In the light emitting device 1 of this embodiment, the first frame body 11 is formed in a substantially a rectangular ring shape in the top view. Note that the first frame body 11 may be formed in various shapes, including a rectangular ring shape, an elliptical ring shape, a circular ring shape, a polygonal ring shape, and the like. In the present specification, the "rectangular shape" includes a square shape.

A height of the first frame body 11 is preferably higher than a height of the light emitting element 2. Thus, the upper surface of the first sealing resin 21 covering the light emitting element 2 can be formed as a substantially flat surface having the substantially same height as the height of the first frame body. The upper surface of the first sealing resin is made substantially flat, so that the light diffusion material layer with the convex upper surface can be easily formed over the first sealing resin. Here, the substantially flat surface allows a slight uneven surface as long as the surface is substantially flat enough to form the light diffusion material layer over the first sealing resin with its convex upper surface, using the flow phenomenon of the light diffusion material contained in the second sealing resin.

(Second Frame Body 12)

The second frame body 12 is provided to surround the first frame body 11 provided on the base substrate 10. The second sealing resin 22 is charged within the region surrounded by the second frame body 12. The second frame body 12 is formed to surround the first frame body and serves to dam the second sealing resin 22 covering the first frame body and the first sealing resin.

A second-frame-body resin is placed in the region where the second frame body 12 is to be formed with a desired shape, and then the second-frame-body resin is cured to obtain the second frame body 12.

The second-frame-body resin may be any resin that can be cured after being molded in a desired shape. However, the second-frame-body resin is preferably a resin having excellent adhesion to the base substrate 10 as well as the second sealing resin. Such resins can include, for example, a silicone resin, an epoxy resin, etc. In the light emitting device 1 of this embodiment, the second frame body 12 is formed in a circular ring shape in the top view, but may be formed in various shapes, including an elliptical ring shape, a square ring shape, a rectangular ring shape, a polygonal ring shape, and the like.

In the light emitting device 1 of this embodiment, the first frame body 11 is formed in a substantially rectangular shape in the top view, and the second frame body 12 is formed in a substantially circular shape in the top view. The light emitting elements 2 are arranged in a matrix within the first frame body 11 having a substantially rectangular shape, which can equalize the distances between the first frame body 11 and the respective light emitting elements 2 in the proximity of the first frame body 11, so that the color unevenness between the center and end of the upper surface of the first sealing resin 21 can be suppressed. Further, the second frame body 12 is formed in a substantially circular shape in the top view, and the dome-shaped lens is disposed to cover the second frame body 12 and the second sealing resin 22, thus making it possible for the light emitting device 1 to act as a light source similar to point light source with a restricted light emission region.

In the light emitting device 1 of this embodiment, in the case where the first frame body and the second frame body have different shapes in the top view, distances between the first frame body and the second frame body are varied. For example, the first frame body has a rectangular shape in the top view, and the second frame body has a circular shape in the top view, a distance from the edge of the rectangular shape to the second frame body is different from that from the center of one side of the rectangular shape to the second frame body. Even in this case, the first frame body being spaced away from the second frame body allows the light diffusion material to be formed to have a concave shape between the first and second frame bodies.

The second frame body 12 is preferably higher than the first frame body 11. Thus, as mentioned later, when the second sealing resin 22 is charged into the region surrounded by the second frame body 12, the second sealing resin 22 can seal the first sealing resin 21.

Taking into consideration the fluidity of the second sealing resin 22 and the precipitation properties of the light diffusion material as mentioned above, the height of the second frame body is preferably approximately 1.05 to 2 times and more preferably approximately 1.15 to 1.5 times the height of the first frame body.

(First Sealing Resin 21)

The first sealing resin 21 is disposed within the first frame body 11 to seal the light emitting elements 2. The height of the first sealing resin 21 is preferably substantially the same as that of the first frame body 11. The upper surface of the first sealing resin is a substantially flat surface having the substantially same height as that of the first frame body, so that the light diffusion material layer with the convex upper surface can be easily formed over the first sealing resin. The first sealing resin 21 contains the wavelength conversion member in a light-transmissive resin.

Suitable materials for the light-transmissive resin included in the first sealing resin 21 include, for example, a silicone resin, a modified silicone resin, an epoxy resin, a modified epoxy resin, a phenol resin, a polycarbonate resin, an acrylic resin, a TPX resin, a polynorbornene resin, and a hybrid resin containing one or more kinds of these resins. Among them, the silicone resin or the epoxy resin is preferably used.

The wavelength conversion member is a member for converting the wavelength of the light emitted from the light emitting elements 2. In such a wavelength conversion member, phosphors that can be excited with light emitted from the light emitting elements are preferably used. Phosphors known in the art can be used as the phosphor. For example, suitable phosphors can include a cerium-activated YAG (yttrium aluminum garnet) based phosphor, a cerium-activated LAG (lutetium aluminum garnet) based phosphor, a europium and/or chrome activated nitrogen-containing calcium aluminosilicate ($CaO—Al_2O_3—SiO_2$) based phosphor, a europium-activated silicate (($Sr, Ba)_2SiO_4$) based phosphor, β sialon phosphor, a chlorosilicate phosphor, a nitride-based phosphor, such as a CASN-based or SCASN-based phosphor, a rare earth metal nitride phosphor, an oxynitride phosphor, a KSF ($K_2SiF_6$: Mn) based phosphor, a sulfide phosphor, and the like. Thus, the light emitting device can be one that emits a mixed light of primary and secondary lights with visible wavelengths (for example, a white-based light), or one that emits a secondary light with a visible wavelength that is excited by a primary ultraviolet light. In particular, a phosphor used for emitting white light in combination with a blue light emitting element is preferably a phosphor that exhibits a broad yellow emission by being excited by the blue light. The phosphor for use in the light emitting element may be a combination of a plurality of kinds of phosphors. The color rendering properties and the color reproductivity can also be adjusted using the combination or the compounding ratio appropriate for a desired color tone.

The phosphor contains granular phosphors in the first sealing resin 21, but is not limited thereto. Alternatively, a layer containing phosphors may be provided. Methods for forming the layer containing phosphors can include, but not limited to, for example, a spraying method, an electrodeposition method, an electrostatic spray coating method, etc. Alternatively, a phosphor sheet or the like made of a material containing a resin with phosphors dispersed thereinto may be bonded onto the light emitting element 2.

The phosphor material may be a light emitting material which is a so-called nanocrystal, or quantum dot. Such materials can include semiconductor materials, for example, a group II-VI, group III-V, or group IV-VI semiconductor, specifically, highly dispersible nano-sized particles made of CdSe, a core-shell CdSXSe1-X/ZnS, GaP, InAs, etc. These kinds of phosphors can include phosphors having a particle size of, for example, 1 to 100 nm and preferably about 1 to 20 nm (corresponding to about 10 to 50 atoms). The use of such a phosphor can suppress internal diffusion, suppress scattering of light having its color changed, and further improve the optical transmittance.

Organic light emitting materials can be used as the phosphor material. Typical organic light emitting materials can include light emitting materials made using organometallic complex, most of which have high transparency. With use of the organic light emitting material as the phosphor material, the same effects as those exhibited in use of the quantum dot phosphor can be obtained.

(Second Sealing Resin 22)

The second sealing resin 22 is disposed within the second frame body 12 to seal the first frame body 11 and the first sealing resin 21. The height of the second sealing resin 22 is substantially the same as that of the second frame body 12. The second sealing resin 22 contains the light diffusion material in the light-transmissive resin. The second sealing resin 22 includes the light diffusion material layer 221 on the lower layer side and a light-transmissive resin layer 222 on the upper layer side, the content of the light diffusion material in the light-transmissive resin layer being smaller than that in the light diffusion material layer. Note that the light diffusion material layer 221 is formed using the flow phenomenon of the light diffusion material contained in the second sealing resin. The boundary between the light diffusion material layer 221 on the lower layer side and the light-transmissive resin layer 222 on the upper layer side is not necessarily clear.

Suitable materials for the light-transmissive resin included in the second sealing resin 22 include, for example, a silicone resin, a silicone modified resin, an epoxy resin, a modified epoxy resin, a phenol resin, a polycarbonate resin, an acrylic resin, a TPX resin, a polynorbornene resin, or a hybrid resin containing one or more kinds of these resins. Among them, the silicone resin or epoxy resin is preferably used.

The light diffusion material layer 221 is formed at the upper surface 10a of the base substrate 10 and at the upper surface of the first sealing resin 21. The upper surface of the light diffusion material layer 221 is formed in a convex shape to have the top portion 221a above the center of the upper surface of the first sealing resin 21.

The upper surface of the light diffusion material layer 221 is formed in a concave shape to have the lowermost portion 221b located between the first frame body 11 and the second frame body 12.

The light diffusion material layer 221 is formed by depositing the light diffusion material. The light diffusion material is to diffuse the light and can increase a viewing angle by relieving the directivity of light from the light emitting element 2.

Suitable materials for the light diffusion material can include, for example, silica, titanium oxide, zirconium oxide, magnesium oxide, magnesium hydroxide, calcium carbonate, calcium hydroxide, calcium silicate, zinc oxide, barium titanate, aluminum oxide, iron oxide, chromium oxide, manganese oxide, glass, carbon black, and the like. In the case where a silicone resin is selected from the above-mentioned examples as the light-transmissive resin included in the second sealing resin 22, silica having a property similar to that of the silicone resin is preferably used.

A preferable particle diameter of the light diffusion material is selected according to the kind of the light-transmissive resin included in the second sealing resin used and the kind of the light diffusion material. For example, in the case where the silicone resin is used as the light-transmissive resin included in the second sealing resin, and silica is used as the light diffusion material, a preferable particle size of silica is in a range of approximately 1 to 2 μm, and a preferable concentration of silica in the silicone resin is in a range of approximately 20 to 30% by weight. By controlling the particle size and the concentration to be in this range, silica might be easily formed in the convex shape over the upper surface of the first sealing resin 21. In comparison between the light diffusion materials with the same weight, the light diffusion material having an excessively large particle size will be uniformly distributed over the upper surface of the first sealing resin 21, while the light diffusion material having an excessively small particle size leads to a decrease in amount of the precipitated diffusion material and thus will be uniformly distributed over the upper surface of the first sealing resin 21. In short, the light diffusion material with the excessively large or small particle size is less likely to be deposited in a convex shape.

Figure 3B:
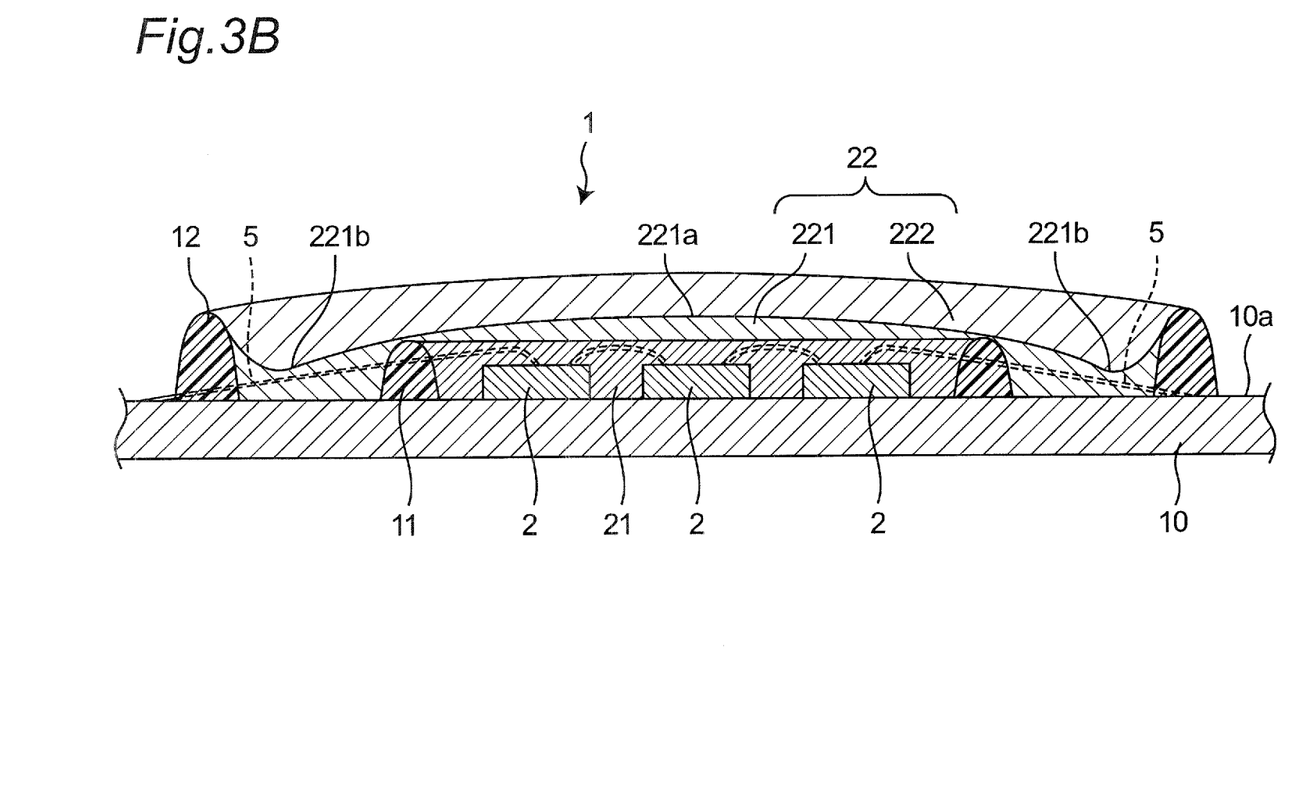
FIG. 3B is a schematic enlarged cross-sectional view of a light emitting device according to a modified example of one embodiment of the present invention.

In this embodiment, the upper surface of the light-transmissive resin layer 222 is formed as a substantially flat surface. However, the upper surface of the light-transmissive resin layer 222 is not limited to the flat surface, and alternatively may be formed in a convex shape with its thick center, for example, as shown in FIG. 3B. The light-transmissive resin layer 222 is made of light-transmissive resin.

The light diffusion material included in the light diffusion material layer 221 has a larger specific gravity than that of the light-transmissive resin included in the light-transmissive resin layer 222. The second sealing resin 22 contains the light diffusion material in the light-transmissive resin. Once the second sealing resin 22 is charged inside the second frame body 12, the light diffusion material contained in the second sealing resin 22 is precipitated by its own weight, resulting in formation of the light diffusion material layer 221 on the lower layer side of the second sealing resin, and the light-transmissive resin layer 222 with a smaller amount of the light diffusion material on the upper layer side of the second sealing resin.

During a step of forming the light diffusion material layer 221, parts of the light diffusion material precipitated in the position close to and on the first frame body 11 at the upper surface of the first sealing resin 21 slip and fall to be deposited between the first and second frame bodies 11 and 12. As a result, the upper surface of the light diffusion material layer 221 becomes thin at the outer periphery of the first sealing resin 21 and thick at the center of the upper surface of the first sealing resin 21. Thus, the upper surface of the light diffusion material layer 221 is formed in the convex shape over the upper surface of the first sealing resin 21.

(Wire 5)

The light emitting device 1 of this embodiment includes the wires 5 for electrically connecting the base substrate 10 to the light emitting element 2. The light emitting elements 2 are electrically connected to the base substrate 10 via the wires 5. The wires 5 penetrate the first frame body 11. Specifically, each wire 5 penetrates the first frame body 11, and thus can set its loop top low, as compared to the case of connecting the wires 5 such that the wires get over the first frame body 11. Thus, the length of each wire 5 can be controlled to the minimum length necessary for connection of the light emitting element 2 to the base substrate 10.

In the light emitting device 1 of this embodiment, preferably, each wire 5 reaches the second frame body 12 or is disposed to penetrate the second frame body 12. The wires 5 penetrate the first frame body 11 to reach the second frame body 12, which can suppress the length of the wires 5 to the minimum value as compared to the case of arranging wires over the second frame body enclosing the regions of the first and second sealing resins 21 and 22.

These wires 5 can be easily formed by connecting the light emitting element 2 to the base substrate 10 with the wires 5, and providing the first frame body 11 so as to enclose the light emitting elements 2. Note that at this time, a height of the first frame body 11 is preferably higher than the loop top of the wire 5. In this way, the wires 5 can be accommodated in the first sealing resin 21 within the region surrounded by the first frame body 11, which can prevent disconnection of the wires 5 due to the influence of thermal expansion at the interface between the first and second sealing resins 21 and 22.

The wire 5 is disposed on the lower layer side of the second sealing resin 22 between the first and second frame bodies 11 and 12. That is, the wire 5 is covered with the light diffusion material layer 221 positioned on the lower layer side of the second sealing resin 22, between the first and second frame bodies 11 and 12. Thus, the wires 5 are protected by the light diffusion material layer 221 having a low coefficient of elasticity and a small linear coefficient of expansion. This can prevent the disconnection of the wire 5 due to the influence of thermal expansion of the sealing resin. Further, the absorption of light is suppressed by the wires 5, resulting in an increase in light emission efficiency of the light emission layer.

The wire 5 preferably has good ohmic contact to an electrode of the light emitting element 2, good mechanical contact, or good electric conductivity and thermal conductivity.

The wire 5 can be made of, for example, metal, such as gold, silver, copper, platinum, aluminum, etc., and an alloy thereof. Further, the wire 5 having its surface coated with silver or silver alloy, etc., can be used. Among them, gold having excellent thermal resistance is preferably used. To enhance the light extraction efficiency, the surface of the wire 5 is preferably coated with or comprised of silver or a silver alloy. The diameter of the wire 5 is not specifically limited, but is in a range of approximately 10 μm to 70 μm, preferably in a range of approximately 15 μm to 50 μm, and more preferably in a range of approximately 18 μm to 30 μm.

(Convex Lens 3)

The light emitting device 1 of this embodiment includes the convex lens 3 covering the second frame body 12 and the second sealing resin 22. The upper surface of the convex lens 3 is formed in a convex shape to have its top portion above the center of the upper surface of the first sealing resin 21. In general, in the case where a lens is provided at a light emitting device with a plurality of light emitting elements, the color unevenness between an area directly above each light emitting element and an area between the respective light emitting elements tends to be emphasized. In the light emitting device 1 of this embodiment, the convex lens 3 is disposed at the center of the upper surface of the first sealing resin 21, and thus can effectively suppress the color unevenness. Note that the lens may be not only the convex lens 3, but also, for example, a plate-shaped lens, a lens with its concave upper surface, or a Fresnel lens. Such shapes of the lens can adjust the directional properties.

The convex lens 3 may be made of any material as long as a light can be extracted from the lens. Suitable materials for use in the convex lens 3 can include, for example, a silicone resin, an epoxy resin, and the like.

(Method for Manufacturing Light Emitting Device 1)

As shown in FIG. 4A, the light emitting elements 2 are mounted at the upper surface 10a of the base substrate 10. Then, the light emitting elements 2 are electrically connected to the base substrate 10 via the wires 5. Thereafter, as shown in FIG. 4B, the first frame body is formed which is made of the first frame body resin at the upper surface 10a of the base substrate 10 so as to surround the light emitting elements 2 and then cured. Further, the second frame body 12 is formed of the second frame body resin at the upper surface 10a of the base substrate 10 so as to surround the first frame body 11, and then cured As shown in FIG. 4C, the first sealing resin 21 is charged into the region surrounded by the first frame body 11 to cover the light emitting elements 2. As illustrated in FIG. 4D, the uncured second sealing resin 22 containing the light diffusion material is charged into the region surrounded by the second frame body 12 to cover the first frame body and the first sealing resin 21. At this time, as mentioned above, the light diffusion material in the uncured second sealing resin 22 has a larger specific gravity than that of the light-transmissive resin, and thus is precipitated toward the lower side of the second sealing resin 22. As a result, as shown in FIG. 3A, the light diffusion material layer 221 is formed in the convex shape over the upper surface of the first sealing resin 21, while being formed in the concave shape between the first and second frame bodies 11 and 12. Note that the second frame body 12 may be formed after the first sealing resin 21 is charged into the first frame body 11.

Thereafter, as shown in FIG. 2, the convex lens 3 is provided to cover the second frame body 12 and the second sealing resin 22, so that the light emitting device 1 can be manufactured.

While the embodiments of the present invention have been described above, the present invention is not limited to the above embodiments, and various design changes can be made to those embodiments without departing from the scope of the present invention.

Examples of the light emitting device according to the embodiments of the present invention will be described in detail below with reference to the accompanying drawing.

As illustrated in FIGS. 1 to 3A, the light emitting device 1 of one example includes the first frame body 11 disposed at the upper surface 10a of the base substrate 10, the second frame body 12 surrounding the first frame body 11, the light emitting elements 2 mounted in the region surrounded by the first frame body 11, the first sealing resin 21 covering the light emitting elements 2, and the second sealing resin 22 covering the first sealing resin and disposed in the region surrounded by the second frame body.

The base substrate 10 is a flat-plate shaped lead frame, and has its surface made of a Cu alloy and plated with Ag. The lead frame has a pair of positive and negative leads, namely, an anode lead and a cathode lead. An insulating member is disposed between the anode lead and the cathode lead to produce a plate-shaped base substrate 10. Note that in the light emitting device 1 of the example, the first frame body 11 and the second frame body 12 are provided over the cathode lead, so that a gap between the anode lead and the cathode lead (P—N gap) is not exposed in the region surrounded by the first and second frame bodies 11 and 12. For this reason, the insulating member disposed between the anode lead and the cathode lead does not need to be formed using material having a high light reflectivity. In the example, a black polyphthalamide resin is used.

The light emitting elements 2 are mounted at the upper surface 10a of the base substrate 10. Each light emitting element 2 is electrically connected to an anode lead and a cathode lead using the wires 5. The light emitting element 2 emits blue light. Nine light emitting elements are arranged in a matrix of 3×3 to have a substantially rectangular-shaped pattern in the top view. The light emitting element 2 is formed by stacking a GaN-based semiconductor layer on a sapphire substrate. The light emitting elements 2 are mounted within the region surrounded by the first frame body 11, at the upper surface 10a of the base substrate 10. The first frame body 11 is formed in a substantially rectangular shape in the top view to surround the nine light emitting elements 2 arranged in the matrix. Thus, in the light emitting elements 2 that are arranged in the substantially square-shaped pattern in the top view, the distance from the outer periphery of the square of each light emitting element to the first frame body 11 is equalized, which can reduce the color unevenness in the vicinity of the first frame body.

Further, the second frame body 12 surrounding the first frame body is formed at the upper surface 10a of the base substrate 10 while being spaced away from the first frame body 11. In the example, the height of the first frame body 11 is 250 μm, and the height of the second frame body 12 is 350 μm. The first and second frame bodies 11 and 12 are formed using silicone resin. In the silicone resin, titanium oxide is contained as the light reflective member. The light reflective member is contained in the resin material constituting the first and second frame bodies 11 and 12, so that the light can be effectively reflected by the inner wall surfaces of the first and second frame bodies 11 and 12, so that the light extraction efficiency of the light emitting device can be improved.

The use of the same resin material for the first and second frame bodies 11 and 12 can perform the curing step of both the first and second frame bodies 11 and 12 at the same time, so that the process time can be reduced.

The first sealing resin 21 is disposed within the region surrounded by the first frame body 11. The first sealing resin 21 includes the wavelength conversion member that covers the light emitting elements 2 and converts a wavelength of light emitted from the light emitting elements 2. A phenyl-based silicone resin is used as the first sealing resin 21. In the silicone resin, a YAG-based phosphor, a LAG-based phosphor, and a SCASN-based phosphor are contained.

The second sealing resin 22 is disposed within the region surrounded by the second frame body 12. The second sealing resin 22 covers the first frame body 11 and the first sealing resin 21, and has the light diffusion material layer 221 on the lower layer side thereof. A phenyl-based silicone resin is used as the second sealing resin 22. In the silicone resin, silica is contained as the light diffusion material. In the example, the silica used has an average particle size of about 1.6 μm, and the concentration of the silica in the silicone resin is 25% by weight. Silica contained in the second sealing resin 22 forms the light diffusion material layer 221 having its convex upper surface, over the first sealing resin 21.

The light emitting device of this embodiment includes the semispherical convex lens 3 covering the second frame body 12 and the second sealing resin 22. In this example, the light emitting elements 2 are arranged in the matrix of 3×3. In general, the color unevenness near the light emitting element positioned at the center tends to be emphasized by magnifying with a lens. However, in the light emitting device 1 of the present example, silica is formed in the convex shape having its top portion over the center of the upper surface of the first sealing resin 21. Thus, the color unevenness of can be effectively reduced.

The second frame body is formed in a substantially circular shape in the top view so as to be placed within the bottom surface part of the semispherical convex lens 3 in the top view. The convex lens 3 is formed using a transparent dimethyl silicone resin. The diameter of the second frame body having the substantially circular shape in the top view is set close to the diameter of the semispherical convex lens 3, so that most of the wires 5 can be accommodated in the second frame body and the second sealing resin, thereby preventing disconnection of the wires 5 due to the influence of thermal expansion of the convex lens 3. Further, the absorption of light is suppressed by the wires 5, resulting in an increase in light emission efficiency of the light emission layer.

In the example, the first frame body 11, the second frame body 12, the first sealing resin 21, the second sealing resin 22, and the convex lens 3 are formed using a silicone resin. A base material for each of these members is a silicone resin, which can improve the adhesion between the members. The respective members have similar liner coefficients of expansion, and are less likely to be peeled off each other due to the thermal expansion. Further, the sapphire substrate of the light emitting element, the sealing resin, and the lens resin are formed using materials that have reflective indices gradually decreased in this order, which can reduce loss of light at the interface between the respective members, and thus improving the light extraction efficiency.

What is claimed is:

1. A light emitting device comprising:
a base substrate;
a first frame body disposed on an upper surface of the base substrate;
a second frame body disposed on the upper surface of the base substrate, and surrounding the first frame body while being spaced away from the first frame body;
a plurality of light emitting elements disposed within a region surrounded by the first frame body;
a first sealing resin disposed within the region surrounded by the first frame body to cover the light emitting elements, the first sealing resin including a wavelength conversion member for converting a wavelength of light emitted from each of the light emitting elements; and
a second sealing resin disposed within a region surrounded by the second frame body, the second sealing resin including a light diffusion material layer having a convex upper surface over the first sealing resin,
wherein an upper surface of the light diffusion material layer between the first frame body and the second frame body is formed in a concave shape.

2. The light emitting device according to claim 1, wherein the first sealing resin further includes a light-transmissive resin, and a silicon resin is used as the light-transmissive resin.

3. The light emitting device according to claim 1, wherein the light emitting elements are connected to the base substrate by wires, and the wires penetrate the first frame body.

4. The light emitting device according to claim 3, wherein the light emitting elements are connected to the base substrate by wires, and the wires penetrate the second frame body.

5. The light emitting device according to claim 1, wherein the first frame body is formed in a substantially rectangular ring shape in the top view.

6. The light emitting device according to claim 1, further comprising a convex lens covering the second frame body and the second sealing resin.

7. The light emitting device according to claim 6, wherein the second frame body is formed in a substantially circular ring shape in the top view.

8. The light emitting device according to claim 6, wherein the upper surface of the light diffusion material layer has a top portion above a center of the upper surface of the first sealing resin.

9. The light emitting device according to claim 1, wherein a height of the second frame body is higher than a height of the first frame body.

10. The light emitting device according to claim 9, wherein the height of the second frame body is 1.15 to 1.5 times higher than the height of the first frame body.

11. The light emitting device according to claim 1, further including a light-transmissive resin layer, wherein an upper surface of the light-transmissive resin layer is formed in a convex shape.

12. The light emitting device according to claim 1, wherein the second sealing resin further includes a light-transmissive resin, and a silicon resin is used as the light-transmissive resin.

13. The light emitting device according to claim 12, wherein the light diffusion material layer includes a light diffusion material, and a silica is used as the light diffusion material.

14. The light emitting device according to claim 13, wherein a preferable particle size of silica is in a range of 1 to 2 μm.

15. The light emitting device according to claim 1, wherein the first frame body is made of a resin.

16. The light emitting device according to claim 15, wherein a cross-sectional shape of the first frame body a semicircle.

17. A method of manufacturing a light emitting device, the method comprising:
disposing a plurality of light emitting elements at an upper surface of a base substrate;
providing a first frame body at the upper surface of the base substrate so as to surround the light emitting elements, and
providing a second frame body at the upper surface of the base substrate so as to surround the first frame body;
charging a first sealing resin containing a wavelength conversion member into a region surrounded by the first frame body to cover the light emitting elements; and charging a second sealing resin containing a light diffusion material into a region surrounded by the second frame body so as to cover the first sealing resin to precipitate the light diffusion material contained in the second sealing resin, thereby forming a light diffusion material layer having a convex upper surface over the first sealing resin, wherein an upper surface of the light diffusion material layer between the first frame body and the second frame body is formed in a concave shape.

\* \* \* \* \*